(12) United States Patent
Robb et al.

(10) Patent No.: US 7,297,603 B2
(45) Date of Patent: Nov. 20, 2007

(54) BI-DIRECTIONAL TRANSISTOR AND METHOD THEREFOR

(75) Inventors: Stephen P. Robb, Fountain Hills, AZ (US); Francine Y. Robb, Fountain Hills, AZ (US); Robert F. Hightower, Scottsdale, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 315 days.

(21) Appl. No.: 11/093,381

(22) Filed: Mar. 31, 2005

(65) Prior Publication Data

US 2006/0226439 A1   Oct. 12, 2006

(51) Int. Cl.
*H01L 21/336* (2006.01)
(52) U.S. Cl. .................. 438/289; 257/E21.135
(58) Field of Classification Search ........... 438/270, 438/289; 738/271; 257/E21.135
See application file for complete search history.

(56) References Cited

U.S. PATENT DOCUMENTS

| | | | |
|---|---|---|---|
| 4,847,522 A | 7/1989 | Fuller et al. | |
| 6,084,264 A | 7/2000 | Darwish | |
| 6,351,009 B1 | 2/2002 | Kocon et al. | |
| 6,573,562 B2 * | 6/2003 | Parthasarathy et al. | 257/338 |
| 6,624,469 B1 | 9/2003 | Harada | |
| 6,661,277 B2 | 12/2003 | Dabral | |
| 6,674,305 B1 | 1/2004 | Sheng et al. | 326/81 |
| 6,777,745 B2 | 8/2004 | Hshieh et al. | |
| 6,916,712 B2 | 7/2005 | Kocon et al. | |
| 6,943,408 B2 | 9/2005 | Wu et al. | |

OTHER PUBLICATIONS

Data Sheet "NTLTD7900ZR2 Power MOSFET 9A, 20 V, Logic Level, N-Channel Micro-8 Leadless", Semiconductor Components Industries, LLC, Aug. 2004—Rev. 4, pp. 1-7.

* cited by examiner

*Primary Examiner*—Scott B. Geyer
*Assistant Examiner*—Elias Ullah
(74) *Attorney, Agent, or Firm*—Robert F. Hightower

(57) ABSTRACT

In one embodiment, a transistor is formed to conduct current in both directions through the transistor.

13 Claims, 6 Drawing Sheets

BI-DIRECTIONAL TRANSISTOR AND METHOD THEREFOR

This application is related to an application entitled "METHOD OF FORMING AN INTEGRATED POWER DEVICE AND STRUCTURE" that is filed concurrently herewith having at least one common inventor, a common assignee, and an Ser. No. of 11/095,135.

BACKGROUND OF THE INVENTION

The present invention relates, in general, to electronics, and more particularly, to methods of forming semiconductor devices and structure.

In the past, portable electronic systems often were powered by multiple power sources such as one of two batteries or from a battery and an AC wall outlet via an ac/dc converter or battery charger. A network of switches generally was used to control the flow of power depending on the mode of operation. For instance, if the portable device was powered from a primary battery while a secondary battery was charged, some switches were closed while other switches were open. In another mode, the switches may have been reversed. To be effective in all modes, the switches should have conducted and blocked in both directions. However, power metal oxide semiconductor field effect transistors (power MOSFETs) could only block voltage in one direction. In the reverse direction the body diode of the MOSFET conducted current, thus, two power MOSFETs typically were connected in series to function as one switch. The two power MOSFETS typically were used with their drains tied together so that when the gate voltage was zero, one of the devices would always block the voltage applied across the two transistors regardless of the polarity. One example of such a switch was the NTLTD7900 offered by ON Semiconductor of Phoenix Ariz. Because such switches used two transistors, the switches used twice as much silicon as one transistor which increased the costs. Additionally, the on-resistance was high because the two transistors were in series.

Accordingly, it is desirable to have a method of forming a bi-directional switch that reduces costs, and that reduces the resistance of the bi-directional switch.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. For clarity of the drawings, doped regions of device structures are illustrated as having generally straight line edges and precise angular corners. However, those skilled in the art understand that due to the diffusion and activation of dopants the edges of doped regions are generally not straight lines and the corners are not precise angles.

DETAILED DESCRIPTION OF THE DRAWINGS

Figure 1:
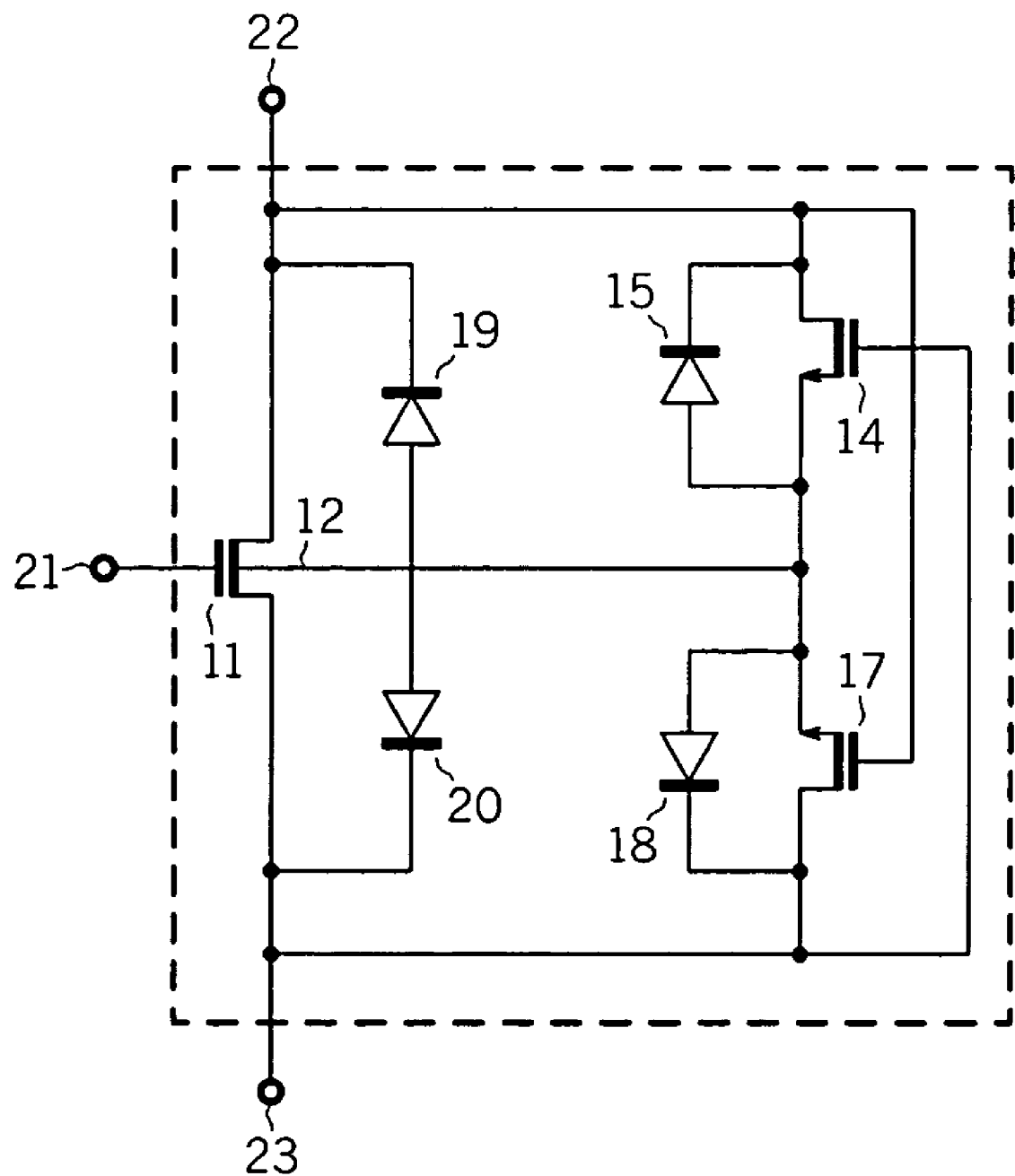
FIG. 1 schematically illustrates a circuit representation of a portion of an embodiment of a bi-directional transistor in accordance with the present invention.

FIG. 1 schematically illustrates a circuit representation of a bi-directional transistor 10 that can conduct current in both directions through transistor 10 and block reverse voltages in both directions across transistor 10. Transistor 10 includes a first MOS transistor 11, a first switch or first switch transistor 14, and a second switch or second switch transistor 17. Transistor 10 also includes a control electrode or gate 21 and current carrying electrodes 22 and 23 that can function as the source and drain of transistor as will be seen further hereinafter. Although transistors 10, 11, 14, and 17 are illustrated and described herein as N-channel transistors, transistor 10 and transistors 11, 14, and 17 may also be implemented as P-channel transistors. As will be seen further hereinafter, transistor 11 includes a body region or body 12 that is isolated from both current carrying electrodes of transistor 11. In order to facilitate the bi-directional current conduction through transistor 10, body 12 is not directly connected to either current carrying electrode of transistor 11 but is selectively coupled to either of current carrying electrodes 22 and 23 by transistors 14 and 17 responsively to the signals that are applied on the first current carrying electrode and the second current carrying electrode of transistor 10. The source of a transistor typically is the electrode connected to the body of the transistor. Because body 12 is not directly connected to either the source or the drain of transistor 11, it is not clear in the circuit schematic representation of transistor 10 which current carrying electrode of transistor 10 is identified as the source or the drain of transistor 10. A parasitic source-drain diode of transistor 14 is illustrated by a diode 15, and a parasitic source-drain diode of transistor 17 is illustrated by a diode 18.

In operation, if the voltage of the signal applied to current carrying electrode 22 is greater than the voltage of the signal applied to current carrying electrode 23, then electrode 22 functions as the drain and electrode 23 functions as a source of transistors 10 and 11. If the voltage applied to gate 21 relative to the voltage applied to electrode 23 is less than the threshold voltage of transistor 11, transistor 11 is in an off state. The gate of transistor 14 is at a low voltage, thus, transistor 14 is also off. The gate of transistor 17 is at the voltage that is applied to electrode 22. Assuming that the voltage applied to electrode 22 is greater than the threshold of transistor 17, transistor 17 is turned on and couples body 12 to current carrying electrode 23 thereby ensuring that body 12 is connected to the lowest voltage that is applied to transistor 10. This facilitates transistor 10 withstanding the voltage applied between electrodes 22 and 23. If the voltage applied to gate 21 is changed to be greater than the threshold voltage of transistor 11, transistor 11 is on, thus, the voltage on electrode 22 is substantially the same as the voltage applied to electrode 23 (minus the Vds-on of transistor 11). Consequently, the voltage applied to the gate of transistors 14 and 17 is also low and both of transistors 14 and 17 are off. Body 12 is floating but, due to diode 18, will never be more that about 0.6 V greater than the voltage on electrode 23. Since transistor 11 is on, current can flow from electrode 22 through transistor 11 to electrode 23. Because transistor 10 is on, transistor 11 does not have to block voltages applied between electrodes 22 and 23 thus the connection of body 12 is not important.

If these signals applied to electrodes 22 and 23 are reversed such that the highest voltage is applied to electrode 23 and the lower voltage is applied to electrode 22, then electrode 22 functions as the source and electrode 23 functions as the drain of transistors 10 and 11. If the voltage applied to gate 21 is again less than the threshold voltage of transistor 11 relative to the voltage applied to electrode 22, then transistor 11 is off. The gate of transistor 17 receives the low voltage from electrode 22, thus transistor 17 is off. The gate of transistor 14 receives the high voltage from electrode 23 which enables transistor 14 to connect body 12 to electrode 22 and to the lowest voltage applied to transistor 10. This connection facilitates transistor 10 withstanding the voltage applied between electrodes 22 and 23. If the voltage applied to gate 21 is changed to be greater than the threshold voltage of transistor 11, transistor 11 is on and current flow is enabled from electrode 23 through transistor 11 to electrode 22. Because transistor 11 is on, the voltage on electrode 23 is substantially the same as the voltage applied to electrode 22 (minus the Vds-on of transistor 11). Consequently the voltage applied to the gate of transistors 14 and 17 is also low and both of transistors 14 and 17 are off. Body 12 is floating but, due to diode 15, will never be more that about 0.6 V greater than the voltage on electrode 22. Since transistor 11 is on, transistor 11 does not have to block voltages thus the connection of body 12 is not important.

In order to assist in providing this functionality for transistor 10, a drain of transistor 14 is commonly connected to the gate of transistor 17 and current carrying electrode 22 of transistors 10 and 11. A source of transistor 14 is commonly connected to body 12 and to the source of transistor 17. A drain of transistor 17 is commonly connected to the gate of transistor 14 and to current carrying electrode 23 of transistors 10 and 11.

Figure 2:
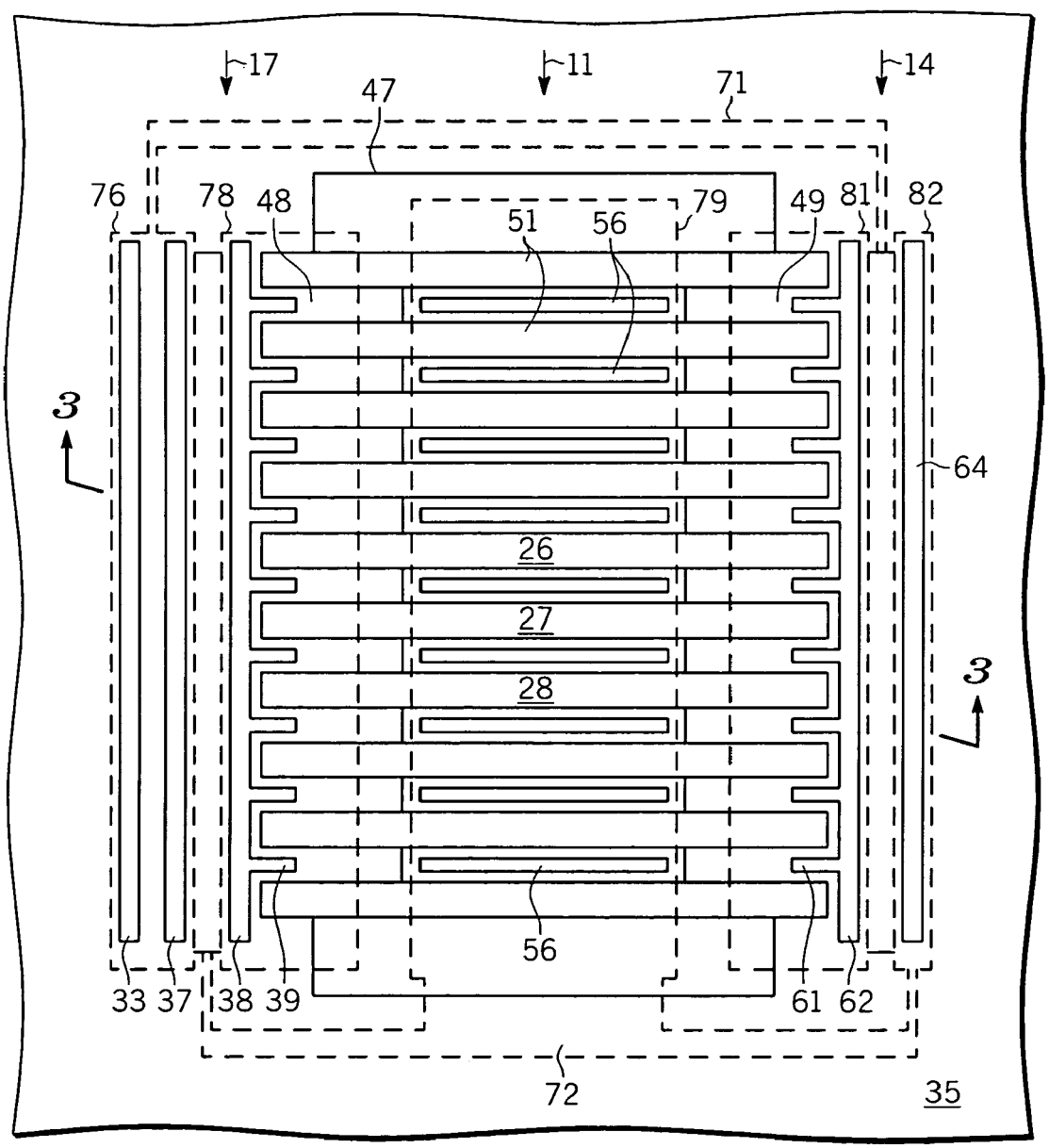
FIG. 2 schematically illustrates an enlarged plan view of a portion of an embodiment of the bi-directional transistor of FIG. 1 in accordance with the present invention.

FIG. 2 illustrates an enlarged plan view of a portion of an embodiment of transistor 10 that is described in the description of FIG. 1.

Figure 3:
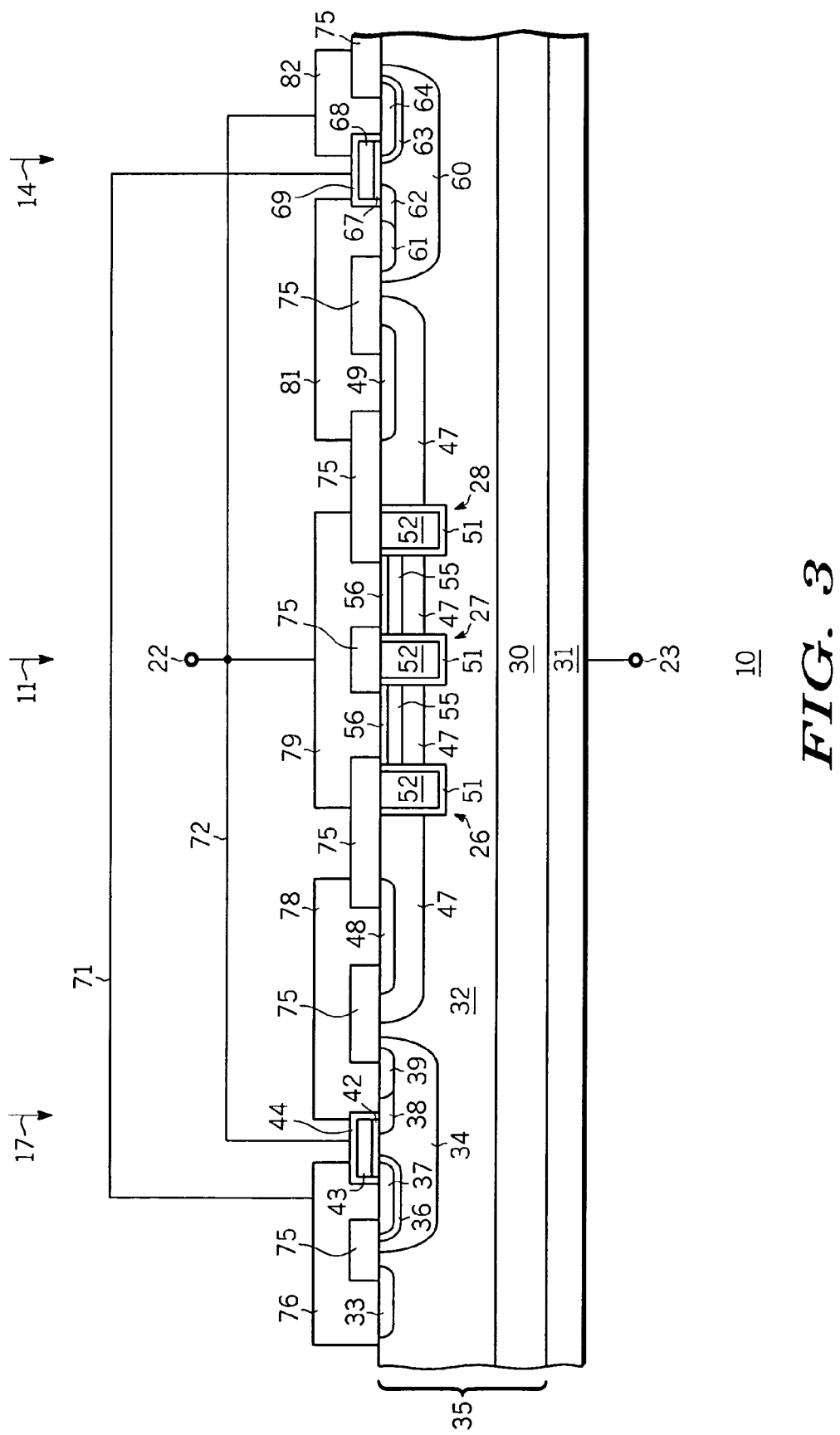
FIG. 3 illustrates a cross-sectional portion of the embodiment of the bi-directional transistor of FIG. 2 in accordance with the present invention.

FIG. 3 illustrates a cross-sectional portion of the embodiment of transistor 10 illustrated in FIG. 2 along section line 3-3. For clarity of the drawings, section 3-3 is drawn through transistor 10 at an angle in order to show a maximum of underlying features. Those skilled in the art will realize that using an angle cross-section will show underlying features as distorted from a right angle cross-section line, however such distortion is not shown in FIG. 3 for clarity of the drawings and clarity of the explanation. This description has references to both FIG. 2 and FIG. 3. In one embodiment, transistor 11 is an N-channel vertical power MOSFET that has trench gates and transistors 14 and 17 are lateral N-channel transistors. In this embodiment, transistor 11 has multiple trench gates that typically extend parallel to each other laterally across a semiconductor substrate 35. Substrate 35 typically includes a bulk N-type substrate 30 and an N-type epitaxial layer 32 that is formed on a surface of bulk substrate 30. Transistors 11, 14, and 17 are formed on a first surface of substrate 35. A conductor 31 is formed on a second surface of substrate 30 and functions as a portion of electrode 23 of transistor 10.

Transistor 11 includes a first doped region 47 that is formed on the first surface of substrate 35. Region 47 functions as body 12 of transistor 11 and has a conductivity type that is opposite to the conductivity type of layer 32. The doping concentration of region 47 generally is greater than the doping concentration of layer 32 in order to provide a channel region and to block voltages applied to transistor 10. Regions 47 and layer 32 assist in blocking reverse voltages applied to transistor 10 such as when the voltage applied to electrode 23 is greater than the voltage applied to electrode 22. Region 47 may be doped with boron at a peak concentration between about 1E16 to 1E18 atoms/cm$^3$. Region 47 often is referred to as a pHV region. A doped region 48 and a doped region 49 are formed within region 47 in order to facilitate making electrical contact to region 47. Regions 48 and 49 typically are the same conductivity as region 47 and have a higher doping concentration. Trenches are formed extending from the surface of substrate 35 through region 47 into layer 32 in order to form trench type gates 26, 27, and 28 for transistor 11. Gates 26, 27, and 28 are identified in general by arrows. Section line 3-3 only cuts through gates 26, 27, and 28 so only these gates are illustrated in FIG. 3 even though the illustration of transistor 11 in FIG. 2 shows more gates that gates 26, 27, and 28. An insulator 51, such as silicon dioxide, is formed along the side walls and bottom of each trench. The remainder of the trench is filled with a gate conductor 52, such as polysilicon, in order to form gates 26, 27, and 28. Conductor 52 typically is covered with another portion of insulator 51. A doped region 56 is formed on the surface of substrate 35 and disposed between each trench gate in order to function as a first current carrying electrode (CCE1) for transistor 11. Regions 56 are opposite in conductivity to region 47. Regions 56 may be doped with arsenic to a peak doping concentration between about 5E19 and 1E21 atoms/cm$^3$. Regions 56 typically extend from the surface of substrate 35 a first distance into region 47, typically about 0.15 microns. High voltage regions are formed to assist in blocking forward voltages such as when the voltage applied to electrode 22 is greater than the voltage applied to electrode 23. High voltage regions, also referred to as an nHV region, are formed as doped regions 55 that extend from the surface of substrate 35 a second distance into region 47, typically about 0.5 microns, that is greater than the first distance of region 56 in order to underlie regions 56. Regions 55 may be formed before regions 56 and a portion of regions 55 may be over doped to form regions 56. Regions 55 generally have a doping concentration that is less than the doping concentration of regions 56 in order to provide a high forward breakdown voltage between region 47 and regions 55. A transistor without regions 55 would be able to sustain only a very small reverse voltage, typically less than about eight volts (8 V). However, because of regions 55 transistor 10 can sustain a large forward voltage. Regions 55 may have a peak doping concentration of about 1E16 to 1E18 atoms/cm$^3$ to facilitate transistor 10 sustaining a forward breakdown voltage of at least about fifteen to fifty volts (15-50 V). The forward breakdown voltage can be increased by changing other parameters of transistor 10 such as the thickness of the gate insulator or the depth of the gates of transistor 11. The P-N junction formed at the interface between region 47 and layer 32 forms a parasitic diode that is illustrated as a diode 19 in FIG. 1, and the P-N junction formed at the interface between regions 55 and 47 forms another parasitic diode that is illustrated as a diode 20 in FIG. 1.

Transistor 17 is formed on the surface of substrate 35 and adjacent one side of transistor 11. In the preferred embodiment, transistor 17 includes a doped region 34 that extends across the first surface of substrate 35 parallel to region 47 (see FIG. 2). Region 34 functions as the body of transistor 17 and typically has a conductivity that is opposite to layer 32. A doped region 36 is formed within region 34 and has an opposite conductivity type in order to function as the drain of transistor 17. A doped region 37 is formed within region 36 and has the same conductivity at a higher doping concentration than region 36 in order to facilitate forming electrical contact to region 36. A doped region 38 having a conductivity type and doping concentration similar to region 37 is formed within region 34 and spaced apart from region 36 in order to function as the source of transistor 17. A doped region 39 which has the same conductivity type as region 34 is formed abutting region 38 to assist in forming electrical contact to region 34. A gate of transistor 17 includes a gate insulator 42 that is formed on the surface of substrate 35 and overlying a portion of at least regions 37 and 38, a gate conductor 43 that is formed overlying insulator 42, and a dielectric 44 that covers conductor 43 to insulate conductor 43 from other conductors.

A doped region 33 is formed on the surface of substrate 35 adjacent to region 34 and typically extending parallel to region 34. Region 33 has a conductivity type that is the same as layer 32 and a higher doping concentration and extends into layer 32 in order to form electrical contact to layer 32. Region 33 facilitates forming electrical contact between the drain of transistor 17 and current carrying electrode 23 of transistor 11.

Transistor 14 includes a doped region 60 that is similar to doped region 34 except that doped region 60 extends parallel to a different side of transistor 11. A doped region 63 is formed to extend from the first surface of substrate 35 into region 60 similarly to region 36 and forms the drain of transistor 14. A doped region 64 is formed within region 63 similarly to region 37 to facilitate forming electrical contact to region 63. A doped region 62, that is similar to doped region 38, is form within region 60 and spaced apart from region 63 to function as the source of transistor 14. A doped region 61, that is similar to region 39, is formed abutting region 62 and facilitates forming low resistance electrical contact to region 60. The doping type and concentration of regions 61, 62, 63, and 64 are similar to respective regions 39, 38, 36, and 37.

A conductor 76 is formed to make electrical contact to region 33 and to the drain of transistor 17 through an electrical contact to region 37. A portion of a dielectric 75, such as an inter-layer dielectric, insulates conductor 76 from portions of the surface of substrate 35. Conductor 76 connects the drain of transistor 17 to electrode 23 of transistor 11. A conductor 78 is formed to make electrical contact to region 47 through region 48 and to region 38 in order to connect body 12 to the source of transistor 17. Another portion of dielectric 75 insulates conductor 78 from portions of the surface of substrate 35. Conductors 76 and 78 are illustrated by dashed boxes in FIG. 2 in order to illustrate some of the underlying portions of transistor 10. A conductor 79 extends to overlie and make electrical contact to all regions 56 in order to form electrode 22 of transistor 11. Other portions of dielectric 75 insulate conductor 79 from gates 26, 27, and 28. A conductor 81 is formed to make electrical contact to region 49 and regions 61 and 62 in order to form an electrical contact between body 12 and the source of transistor 14. Another portion of dielectric 75 insulates conductor 81 from other portions of transistors 11 and 14. A conductor 82 is formed to make electrical contact to region 64 in order to form an electrical connection to the source of transistor 14. Conductors 79, 81, and 82 are illustrated by a dashed box in FIG. 2 in order to illustrate some of the underlying portions of transistor 10. As illustrated in FIG. 2, a portion of conductor 82 may extend across substrate 35 as a conductor 72 in order to electrically connect conductor 82 to conductor 79, thus to electrode 22 and the first current carrying electrode (CCE1) of transistor 11, and to the gate of transistor 17 (see FIG. 2). Additionally, a portion of conductor 76 may extend across substrate 35 to form a conductor 71 in order to connect the drain of transistor 17 to the gate of transistor 14. Conductors 71 and 72 are illustrated by dashed lines in FIG. 2 in order to illustrate the underlying regions of transistor 10.

As will be understood by those skilled in the art, the on-resistance of transistors 14 and 17 should be low in order to support a high dv/dt. The on-resistance of transistors 14 and 17 typically is less than approximately twenty-five ohms and preferably is less than about five ohms.

Figure 4:
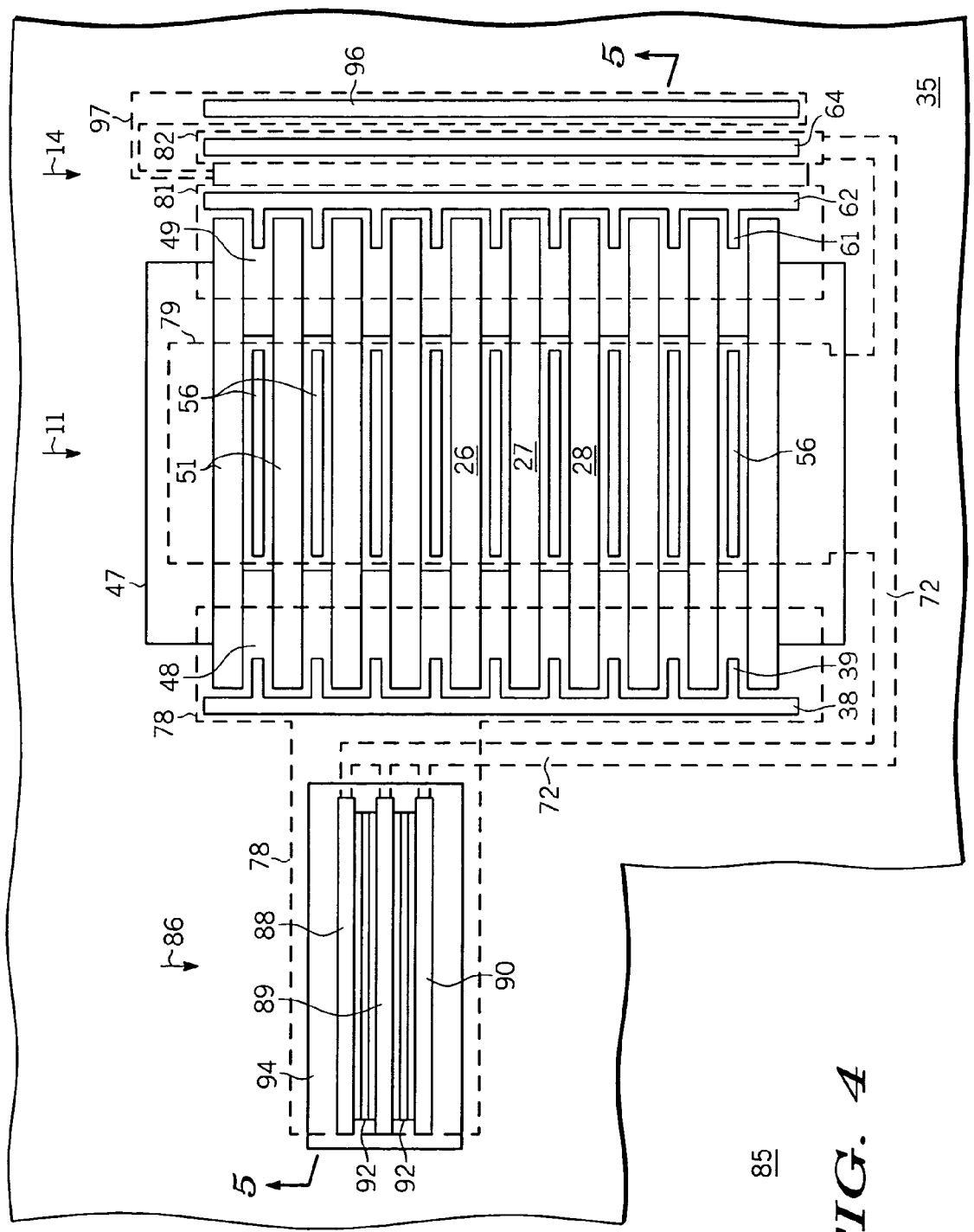
FIG. 4 schematically illustrates an enlarged plan view of a portion of an alternate embodiment of the bi-directional transistor of FIG. 1-FIG. 3 in accordance with the present invention.

FIG. 4 illustrates an enlarged plan view of a portion of an embodiment of a bi-directional transistor 85 that is an alternate embodiment of transistor 10 described in the description of FIG. 1 though FIG. 3.

Figure 5:
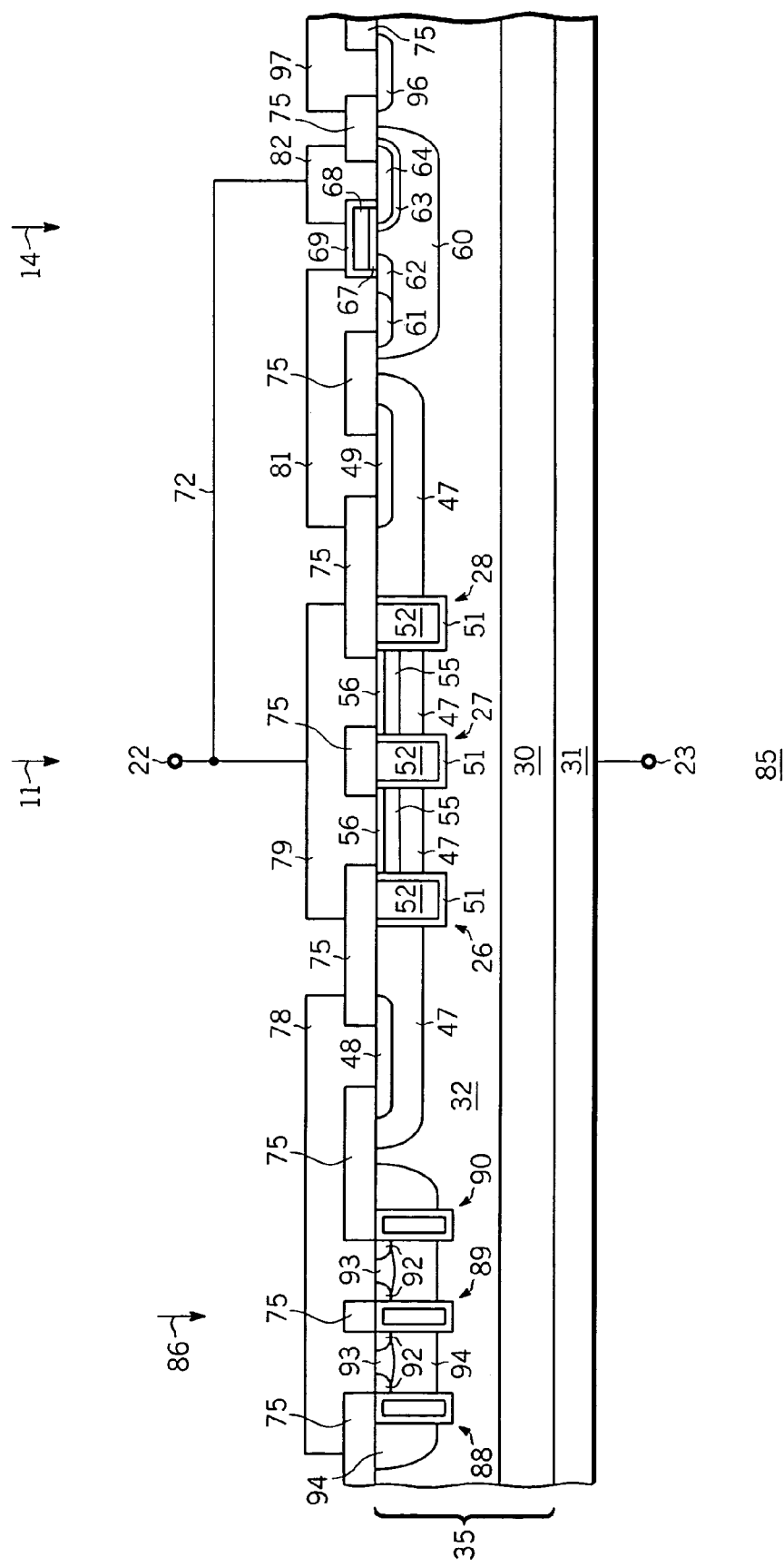
FIG. 5 illustrates a cross-sectional portion of the embodiment of the bi-directional transistor of FIG. 4 in accordance with the present invention.

FIG. 5 illustrates a cross-sectional portion of the embodiment of transistor 85 illustrated in FIG. 4 along section line 5-5. This description has references to FIG. 4 and FIG. 5. Transistor 85 is similar to transistor 10 with lateral MOS transistor 17 replaced by a vertical MOS transistor 86. A vertical transistor can usually be formed to have a lower on-resistance that a lateral transistor. Transistor 86 is formed on a surface of substrate 35. A doped region 94 functions as the body of transistor 86. Region 94 is formed on the surface of substrate 35 substantially the same as region 47 but is spaced apart from region 47. Trench gates 88, 89, and 90 of transistor 86 are formed in a manner similar to gates 26, 27, and 28 of transistor 11. A trench is formed through region 94 and is lined with an insulator similar to insulator 51. A gate conductor similar to conductor 52 is formed within the trench and to be surrounded by insulator 51. Doped regions 93 are formed between gates 88 and 89 and between 89 and 90 to extend from the first surface of substrate 35 into region 94 to facilitate making electrical contact to the body of transistor 86. Region 93 typically has the same conductivity as region 94 but a higher doping concentration. Doped regions 92 are formed between gates 88 and 89 and between gates 89 and 90 to function as the source of transistor 86. Regions 92 generally are formed abutting an adjacent gate and extend to abut an adjacent region 93. Regions 92 usually are doped opposite in conductivity to region 94 and may have a doping concentration of approximately 5E19 to 5E20 atoms/cm$^3$. Conductor 78 is extended to electrically contact regions 92 and region 93 in order to connect the body and the source of transistor 86 to body 12 of transistors 11 and 85. Conductor 82 typically extends across substrate 35 to make electrical contact to the gate of transistor 85 as illustrated in a general manner by dashed lines in FIG. 4. Additionally, a doped region 96 is formed on the surface of substrate 35 and extending into substrate 35 to facilitate forming a low resistance electrical contact to the second current carrying electrode (CCE2) of transistors 85 and 11. Region 96 is formed adjacent to and extending parallel to region 60 and spaced apart from region 60. A conductor 97 is formed to electrically contact region 96 and to extend across substrate 35 to make electrical contact to the gate of transistor 14 as illustrated in a general manner by dashed lines in FIG. 4. Those skilled in the art will appreciate that the placement of transistor 86 is only illustrative and that transistor 86 may be place differently relative to the placement of transistor 11.

Figure 6:
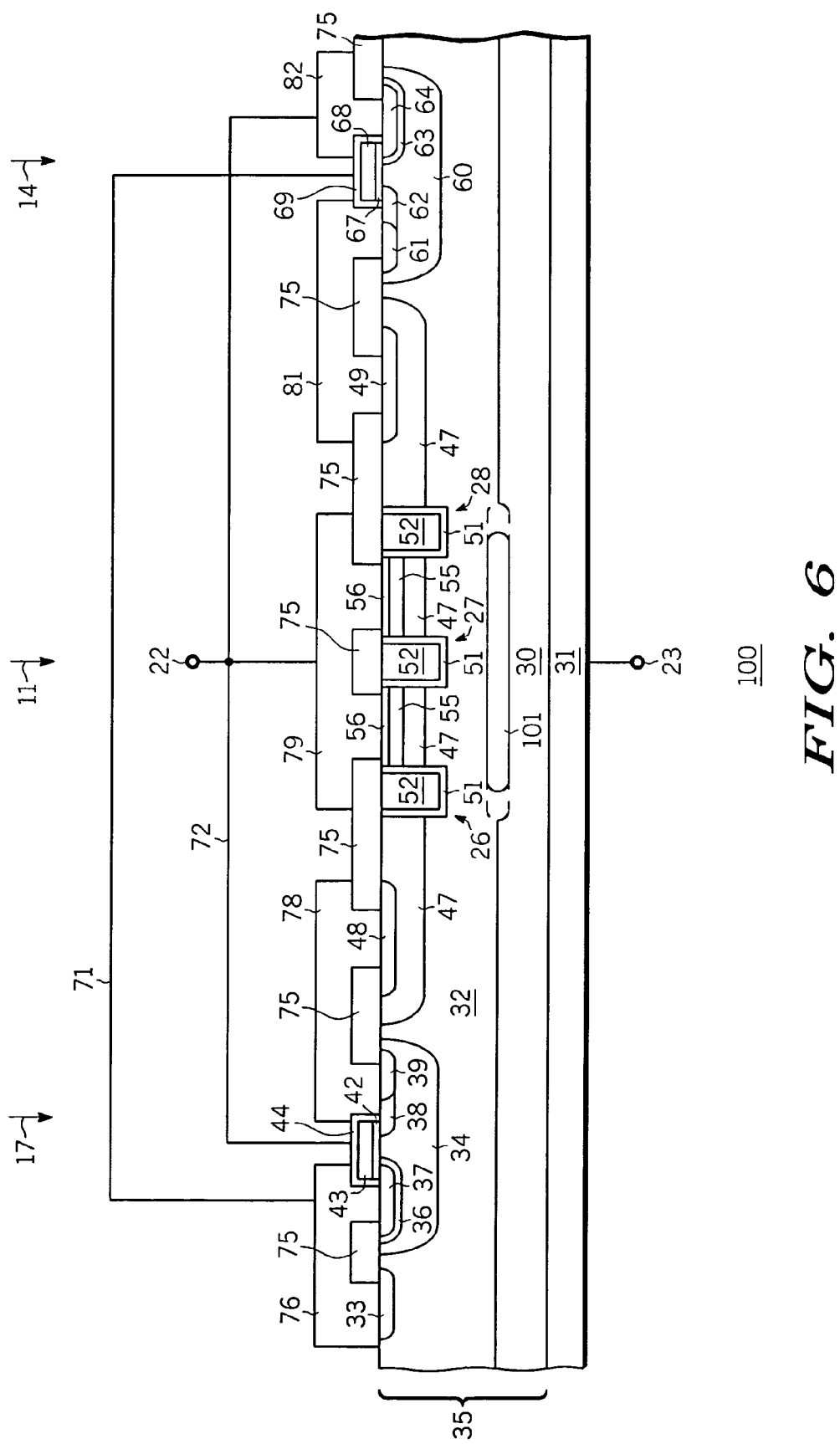
FIG. 6 illustrates a cross-sectional portion of an alternate embodiment of the bi-directional transistor of FIG. 1 and FIG. 2 in accordance with the present invention.

FIG. 6 illustrates a cross-sectional portion of an embodiment-of a bi-directional transistor 100 that is another alternate embodiment of transistor 10 that was explained in the description of FIG. 1 and FIG. 2. Transistor 100 includes a buried layer 101 that assists in reducing the on-resistance of transistor 100. In some embodiments the doping concentration of layer 32 may be light in order to form transistors 14 and 17 in addition to other types of active and passive elements on substrate 35. The light doping could increases the on-resistance of transistor 11. However, buried layer 101 is formed to have a high doping concentration and to underlie the channel region of transistor 11 in order to reduce the on-resistance. The peak doping concentration of layer 32 may be no greater than about 1E16 atoms/$cm^3$ and preferably is no greater than about 1E15 atoms/$cm^3$ and the peak doping concentration of layer 101 may be greater than about 4E16 atoms/$cm^3$ and preferably is greater than about 1E16 atoms/$cm^3$. Buried layer 101 generally is formed along the interface of and extending into both of substrate 30 and layer 32. Layer 101 can be formed by a varied of methods including doping the surface of substrate 30 prior to forming layer 32, forming layer 32 on substrate 30, and annealing substrate 35 to diffuse the dopants into both substrate 30 and layer 32. Layer 101 typically has a length sufficient to at least underlie regions 47. Layer 101 may also extend to underlie a portion of the outermost gates of transistor 11, gates 26 and 28, and may even extend past the innermost edges and to the distal edges of gates 26 and 28 as illustrated by dashed lines.

In view of all of the above, it is evident that a novel device and method is disclosed. Included, among other features, is selectively coupling body 12 to different electrodes of transistor 10 in order to facilitate bi-directional blocking of voltages applied to transistor 10. Forming the nHV region underlying the region 56 facilitates sustaining voltages across transistor 10. Using one transistor instead of two series connected transistors reduces the cost of the bi-directional transistor and systems that use the bi-directional transistor. Using one transistor also reduces the on-resistance.

While the invention is described with specific preferred embodiments, it is evident that many alternatives and variations will be apparent to those skilled in the semiconductor arts. More specifically the invention has been described for a particular N-channel MOS transistor structure, although the method is directly applicable to P-channel transistors as well as to BiCMOS, metal semiconductor FETs (MESFETs), HFETs, and other transistor structures. Also transistors 11 and 86 may be formed as a vertical transistor with traditional surface gates instead of trench gates. Regions 55 would still be used to assist in blocking reverse voltages. Those skilled in the art will realize that other metal layers may be used to assist in forming more electrical contacts to the body regions in order to reduce resistance. Those skilled in the art will appreciate that the placement of the transistors relative to each other is only illustrative and that the transistors may be place differently relative to the placement of other transistors of the bi-directional transistor. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A method of forming a bi-directional transistor comprising:
    forming a first MOS transistor on a semiconductor substrate of a first conductivity type;
    forming a body region of the first MOS transistor as a first doped region of a first conductivity and a first doping concentration on a surface of the semiconductor substrate and isolated from a first current carrying electrode region of the first MOS transistor by a first P-N junction and isolated from a second current carrying electrode region of the first MOS transistor by a second P-N junction;
    forming a source region of the first MOS transistor as a second doped region of a second conductivity type and a second doping concentration that is overlying a portion of the body region;
    forming a third doped region of the second conductivity type between the source region and the body region; and
    forming a second MOS transistor coupled to selectively couple the body region of the first MOS transistor to the first current carrying electrode of the first MOS transistor.

2. The method of claim 1 further including forming the second MOS transistor electrically coupled between the body region of the first MOS transistor and the first current carrying electrode region of the first MOS transistor.

3. The method of claim 1 wherein the first MOS transistor is a vertical transistor and the second MOS transistor is a lateral MOS transistor formed on the semiconductor substrate.

4. The method of claim 1 wherein the first MOS transistor is a vertical transistor and the second MOS transistor is a vertical MOS transistor formed on the semiconductor substrate.

5. The method of claim 1 further including a third MOS transistor coupled to selectively couple the body region of the first MOS transistor to a second current carrying electrode of the first MOS transistor.

6. The method of claim 1 wherein forming the third doped region of the second conductivity type includes forming the third doped with a third doping concentration that is less than the second doping concentration.

7. A method of forming a bi-directional transistor comprising:
    providing a semiconductor substrate of a first conductivity type;
    forming a first doped region of a second conductivity type on a surface of the semiconductor substrate as a body region of a first transistor;
    forming a second doped region of the first conductivity type within the first doped region and extending a first distance into the first doped region as a first current carrying electrode region of the first transistor; and
    forming a third doped region of the first conductivity type and extending from the second doped region a second distance into the first doped region.

8. The method of claim 7 further including forming a fourth doped region of the second conductivity type on the surface of the semiconductor substrate and spaced apart from the first doped region; forming a source and a drain of a second transistor in the fourth doped region; and coupling the second transistor electrically between the first doped region and the semiconductor substrate.

9. The method of claim 8 wherein forming the source and the drain of the second transistor in the fourth doped region includes forming a fifth doped region within the fourth doped region; forming a sixth doped region within the fourth doped region and spaced apart from the fifth doped region; electrically coupling the fifth doped region to the first doped region; and coupling the sixth doped region to the semiconductor substrate.

10. The method of claim 7 further including forming a fourth doped region of the second conductivity type on the surface of the semiconductor substrate and spaced apart from the first doped region; forming a source and a drain of a second transistor in the fourth doped region; and coupling the second transistor electrically between the first doped region and the second doped region.

11. The method of claim 10 wherein forming the source and the drain of the second transistor in the fourth doped region includes forming a fifth doped region within the fourth doped region; forming a sixth doped region within the fourth doped region and spaced apart from the fifth doped region; electrically coupling the fifth doped region to the first doped region; and coupling the sixth doped region to the second doped region.

12. The method of claim 7 wherein forming the first doped region of the second conductivity type on the surface of the semiconductor substrate as the body region of the first transistor includes forming the first transistor as a vertical transistor.

13. A method of forming a bi-directional transistor comprising:
   providing a semiconductor substrate of a first conductivity type;
   forming a first doped region of a second conductivity type on a surface of the semiconductor substrate as a body region of a first transistor;
   forming a second doped region of the first conductivity type having a first doping concentration within the first doped region and extending a first distance into the first doped region as a first current carrying electrode region of the first transistor; and
   forming a third doped region of the first conductivity type having a second doping concentration that is less than the first doping concentration and extending from the second doped region a second distance into the first doped region wherein the second distance is greater than the first distance.

* * * * *